(12) United States Patent
Matsushima et al.

(10) Patent No.: US 8,147,263 B2
(45) Date of Patent: Apr. 3, 2012

(54) MOBILE TERMINAL DEVICE

(75) Inventors: Manabu Matsushima, Kawasaki (JP);
Toshikazu Ishioka, Kawasaki (JP);
Hiroyuki Takita, Kawasaki (JP);
Yoshifumi Kajiwara, Kawasaki (JP);
Kenta Sugimori, Kawasaki (JP);
Haruyoshi Yada, Kawasaki (JP);
Kazunobu Yoneyama, Kawasaki (JP);
Hiroshi Kubo, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 232 days.

(21) Appl. No.: 12/412,896

(22) Filed: Mar. 27, 2009

(65) Prior Publication Data
US 2009/0244835 A1 Oct. 1, 2009

(30) Foreign Application Priority Data

Mar. 31, 2008 (JP) .................................. 2008-093085

(51) Int. Cl.
*H01R 3/00* (2006.01)

(52) U.S. Cl. ........................................ 439/165; 439/31

(58) Field of Classification Search .................. 439/165, 439/31
See application file for complete search history.

(56) References Cited

U.S. PATENT DOCUMENTS

| | | | | |
|---|---|---|---|---|
| 5,681,176 A | * | 10/1997 | Ibaraki et al. | 439/165 |
| 2002/0076960 A1 | * | 6/2002 | Ibaraki et al. | 439/165 |
| 2002/0155740 A1 | * | 10/2002 | Sawada et al. | 439/165 |
| 2004/0077199 A1 | * | 4/2004 | Winstead et al. | 439/165 |
| 2008/0070645 A1 | | 3/2008 | Hsieh | |
| 2008/0102907 A1 | | 5/2008 | Komine | |
| 2008/0130213 A1 | * | 6/2008 | Goto et al. | 361/683 |

FOREIGN PATENT DOCUMENTS

| | | |
|---|---|---|
| JP | 11-330731 | 11/1999 |
| JP | 2007-299072 | 11/2007 |
| JP | 2007-324209 | 12/2007 |

OTHER PUBLICATIONS

Taiwanese Office Action issued Jun. 24, 2011 in corresponding Taiwanese Application No. 98109717.

\* cited by examiner

*Primary Examiner* — Hien Vu
(74) *Attorney, Agent, or Firm* — Staas & Halsey LLP

(57) ABSTRACT

A mobile terminal device includes a movable side housing, a fixed side housing connected to the movable side housing with a hinge part and a thin-wire cable as an electrical current flow passage electrically connected between the movable side housing and the fixed side housing. A cable mount cover member protects the thin-wire coaxial cable. The thin-wire coaxial cable has a cable main body having plural thin wires embedded therein and a cable connector connected to the cable main body, and the cable mount cover has a cable enclosure member enclosing the cable main body and a connector enclosure member enclosing surrounding of the cable connector.

6 Claims, 9 Drawing Sheets

MOBILE TERMINAL DEVICE

CROSS-REFERENCE TO RELATED APPLICATIONS

This application is based upon and claims the benefit of priority of the prior Japanese patent application No. 2008-093085, filed on Mar. 31, 2008, the entire contents of which are incorporated herein by reference.

BACKGROUND OF THE INVENTION

1. Field of the Invention

The present invention relates to a mobile terminal device in which two housings are connected to each other through a connection part so as to be freely superposed on each other. The present invention is related to, for example, a mobile terminal device having a cable protection structure for protecting a thin-wire coaxial cable for electrically connecting two housings.

2. Description of the Related Art

In order to satisfy requirements such as compactness, etc., many recent mobile phones are designed so that two housings can be freely superposed on each other by a folding mechanism based on a hinge structure or the like. The two housings refer to a fixed side housing and a movable side housing. A mobile terminal device in which the fixed side housing and the movable side housing are connected to each other through the hinge structure has a circuit board in the fixed side housing. The mobile terminal device is a mobile phone, for example.

A thin-wire coaxial cable having a shield structure which is electrically connected to the movable side housing is connected to a connector mounted on the circuit board in the fixed side housing. The thin-wire coaxial cable through which the housings are electrically connected to each other as described above has bulk wire portions whose cable parts are independent on one another. It requires much labor to bundle these bulk wire portions, and also there is a risk that breaking of wire may occur when the cable is laid out.

Japanese Laid-open Patent Publication No. 11-330731 discloses a cable protection structure to solve the problem of the wire breaking of the thin-wire coaxial cable as described above. Japanese Laid-open Patent Publication No. 11-330731 discloses a mount structure for supporting wire rods provided in a case for electronic equipment by projections of L-shaped type ribs provided on the side surface of an RF module holder, thereby fixing the wire positions.

Japanese Laid-open Patent publication No. 2007-299072 discloses a mount structure for a thin-wire coaxial cable having a pinching portion with which plural cable bundles are positioned under the state that the bundles are pinched by the pinching portion.

However, it has been difficult to mount the thin-wire coaxial cable in a mobile phone. In more detail, when the thin-wire coaxial cable is mounted on a circuit board base, the mount position of the thin-wire coaxial cable may be displaced, or the bulk wire portion at the end portion side of the thin-wire coaxial cable may be broken due to interference with another mechanical part on the circuit board base.

SUMMARY OF THE INVENTION

According to an aspect of the present invention a mobile terminal device is provided that can secure a wiring route of a thin-wire coaxial cable disposed through a connection part for connecting two housings while the housings are freely superposed on each other.

It is another aspect of the present invention to provide a mobile terminal device that can prevent breaking of the cable.

According to an aspect of the invention, a mobile terminal device includes a movable side housing; a fixed side housing connected to the movable side housing with a hinge part; a thin-wire cable is electrically connected as a current flow passage between the movable side housing and the fixed side housing; and a cable mount cover member for protecting the thin-wire coaxial cable, wherein the thin-wire coaxial cable has a cable main body having plural thin wires embedded therein and a cable connector connected to the cable main body, and the cable mount cover has a cable enclosure member for enclosing the cable main body and a connector enclosure member for enclosing the surrounding of the cable connector.

These together with other aspects and advantages which will be subsequently apparent, will be realized and attained by the elements and combinations particularly described, reference being had to the accompanying drawings forming a part hereof, wherein like numerals refer to like parts throughout and as pointed out in the claims. It is to be understood that both the foregoing general description and the following detailed description are exemplary and explanatory and are not restrictive of the invention, as claimed.

DETAILED DESCRIPTION OF THE PREFERRED EMBODIMENTS

A first embodiment of a mobile terminal device will be described in detail with reference to the accompanying drawings. In this embodiment, an application to a mobile phone as a mobile terminal device will be described. However, the present invention is not limited by this embodiment.

First Embodiment

Figure 1:
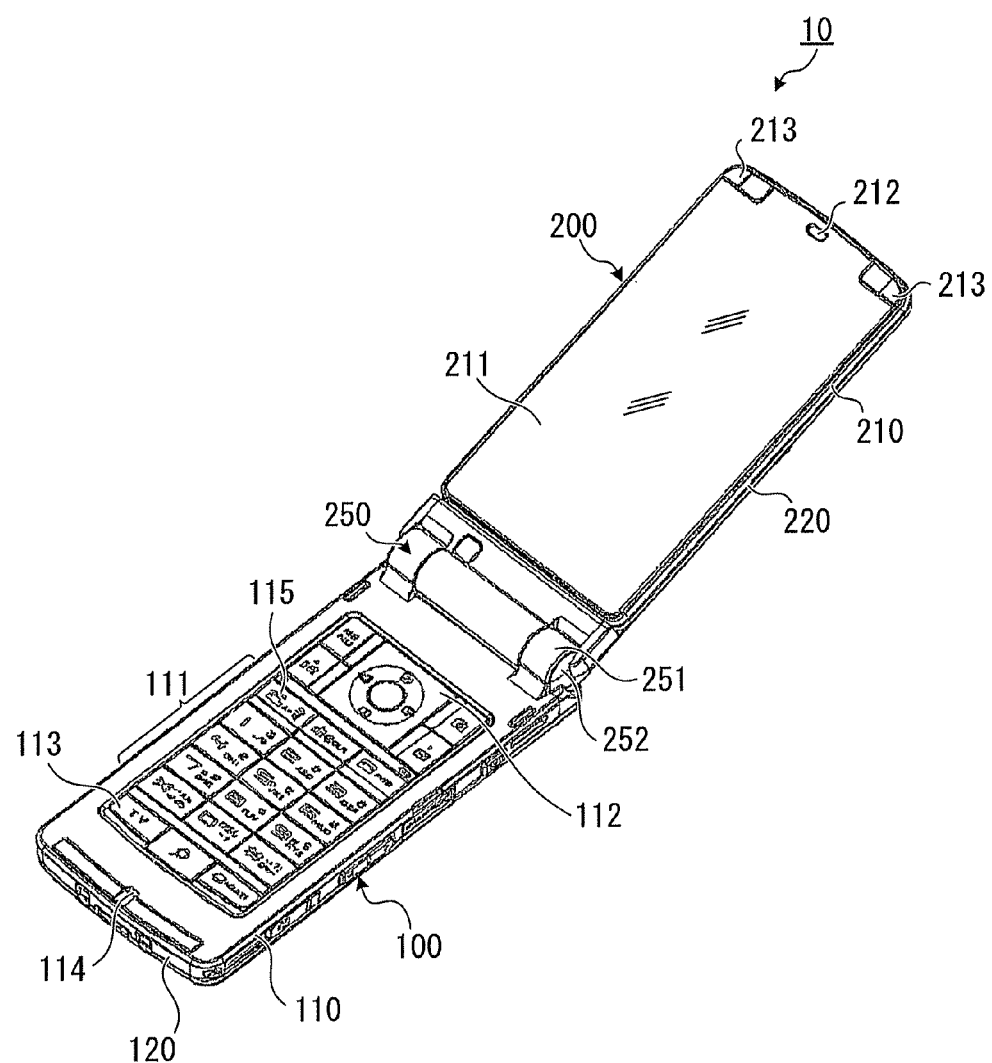
FIG. 1 is a perspective view illustrating an open state of a mobile phone according to a first embodiment.

FIG. 1 is a perspective view illustrating an open state of a mobile phone according to a first embodiment. As shown in FIG. 1, a mobile phone 10 is a folding type mobile phone.

The mobile phone 10 has a fixed side housing 100 and a movable side housing 200 which are designed to be palm-sized, and a connecting hinge 250 for connecting the fixed side housing 100 and the movable side housing 200 so that the fixed side housing 100 and the movable size housing 200 are freely superposed on each other. In this embodiment, the connecting hinge 250 has two hinge structures 251 and 252, and the fixed side housing 100 and the movable side housing 200 are connected to each other through the hinge structures 251 and 252 so as to be freely foldable.

The mobile phone 10 has the fixed side housing 100 which is used for call transmission and also provided with a ten key pad 111 containing numerical ten keys having numerals of 0 to 9 described thereon and various operation keys such as a function key 112 such as a mode setting key, etc. In the mobile phone 10, the fixed side housing 100 and the movable side housing 200 which is designed to have substantially the same size as the fixed side housing 100 and has an LCD module are connected to each other through the connecting part 250 so as to be freely foldable.

The fixed side housing 100 and the movable side housing 200 are formed in a box shape, and magnesium alloy which is light in weight and high in strength or the like is used as material for the housings, for example.

The fixed side housing 100 has a bisectional structure and contains a fixed side front case 110 located at an operation panel 115 side having various kinds of operation keys such as the ten key 111, etc., and a fixed rear case 120 located at the back side.

The ten key pad 111, the function key 112 such as the mode setting key, etc., a videophone key 113 and a mouthpiece 114 having therein a microphone for converting the voice of a user of the mobile phone 10 to an electrical signal are provided to the fixed side front case 110. Each of the fixed side front case 110 and the fixed side rear case 120 is fixed at four positions by fixing screws.

The movable side housing 200 is of a bisectional structure having a movable side front case 210 located at a display panel 211 side and a movable side rear case 220 located at the back side. Each of both the cases 210 and 220 is fixed at four places by fixing screws. The movable side front case 210 is provide with an earpiece 212 through which the user of the mobile phone 10 listens to voices while the user applies the earpiece 212 to user's ear. Blind covers 213 for screws are provided at the upper positions of the display panel 211.

Figure 2:
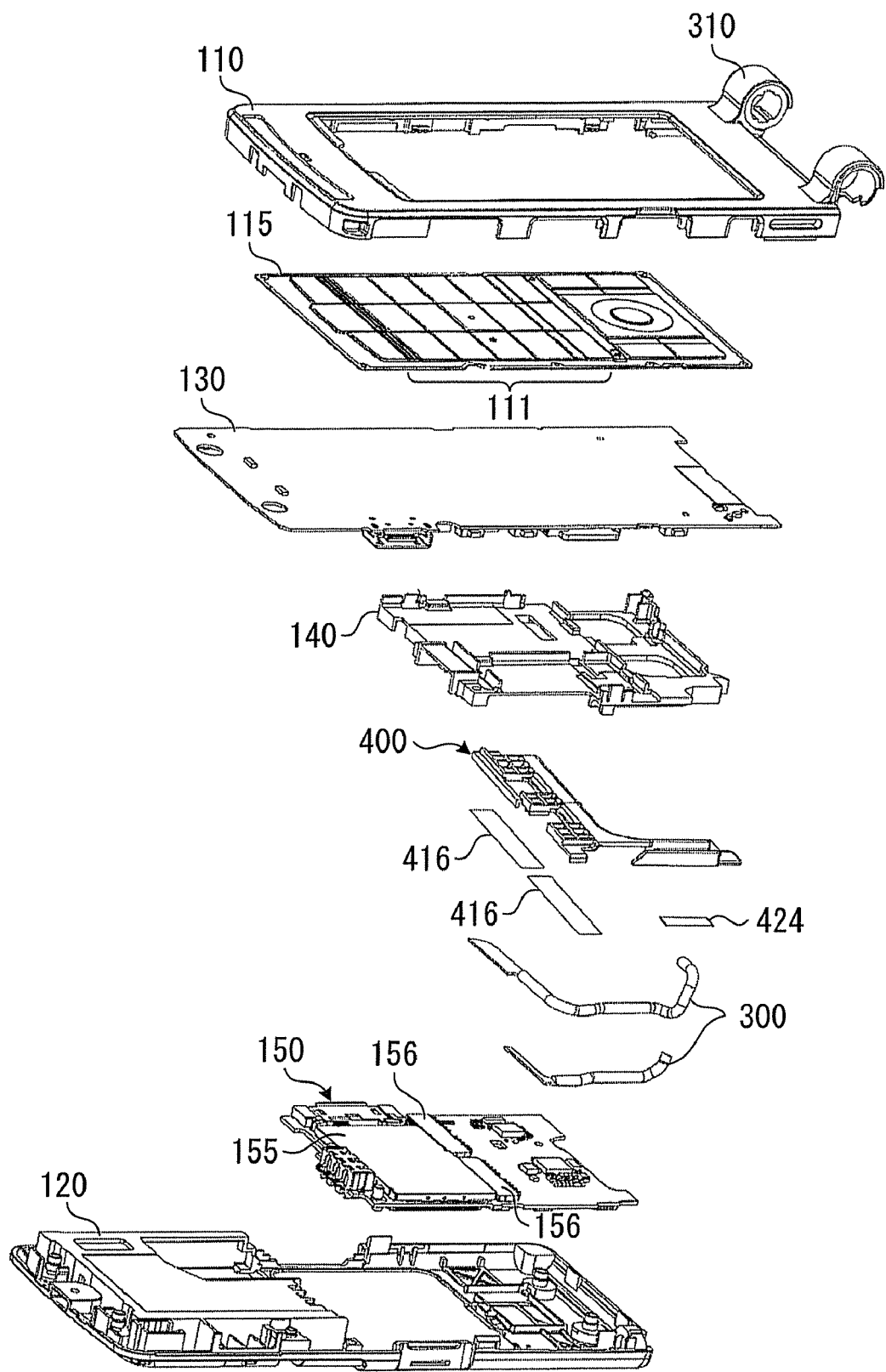
FIG. 2 is an exploded perspective view illustrating the inside of a fixed-side housing.

The internal construction of the fixed side front case 110 and the fixed side rear case 120 constituting the fixed side housing 100 will be described with reference to FIG. 2. FIG. 2 is an exploded perspective view illustrating the inside of a fixed-side housing.

As shown in FIG. 2, the fixed side housing 100 has the fixed side front case 110, the operation panel 115, a fixed side front board 130, a fixed frame 140, a fixed board base 150 and a fixed side rear case 120. In this embodiment, a thin-wire coaxial cable 300 and a cable mount cover 400 are disposed between the fixed frame 140 and the circuit board base 150.

The thin-wire coaxial cable 300 of the first embodiment is disposed on the circuit board base 150 of the circuit board 155 while mounted in a cable enclosure member 420 and a connector enclosure member 410 of the cable mount cover 400, so that the positional displacement and the breaking of the cable at the mount time of the thin-wire coaxial cable 300 can be prevented.

[Construction of Cable Mount Cover 400]

Figure 3A:
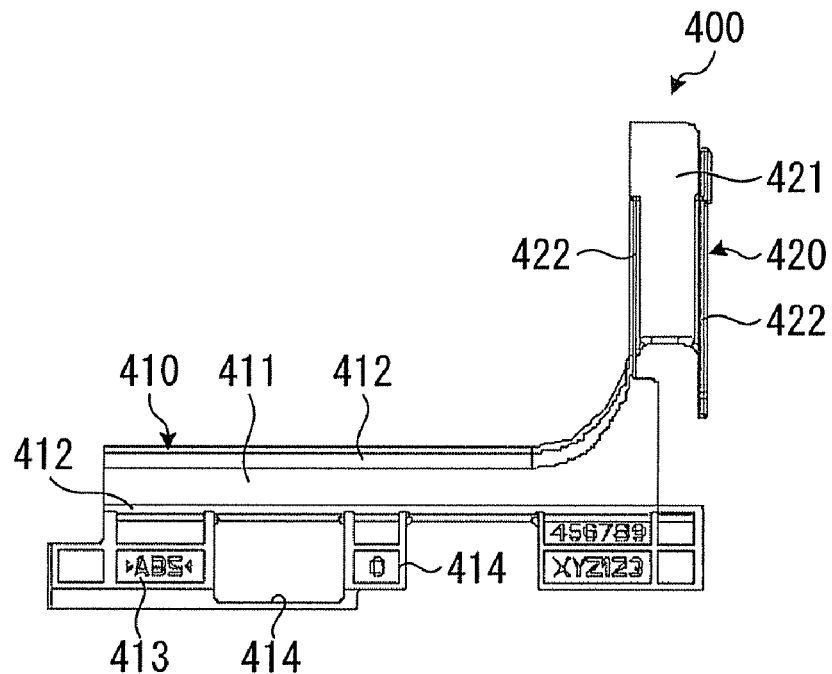
FIG. 3A is a plan view illustrating the overall construction of a cable mount cover.
Figure 3B:
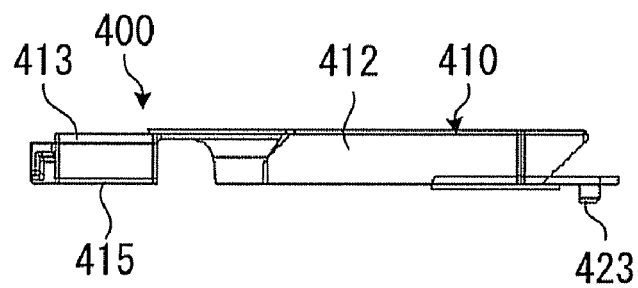
FIG. 3B is a side view illustrating the overall construction of the cable mount cover.
Figure 3C:
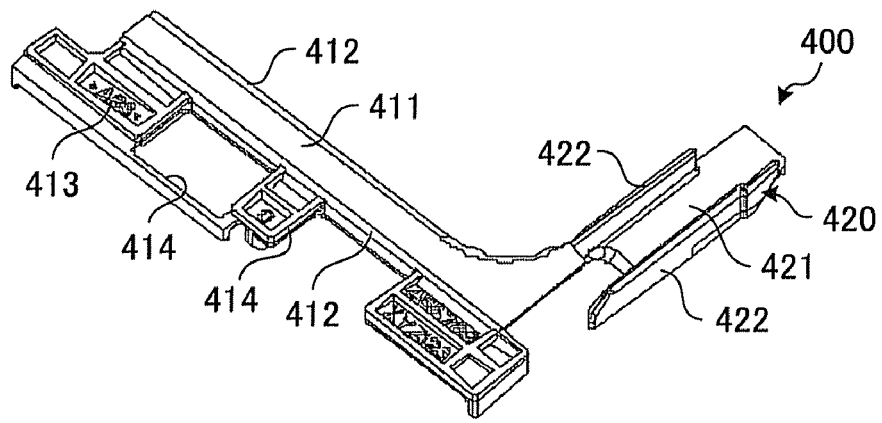
FIG. 3C is a top perspective view illustrating the overall construction of the cable mount cover.
Figure 3D:
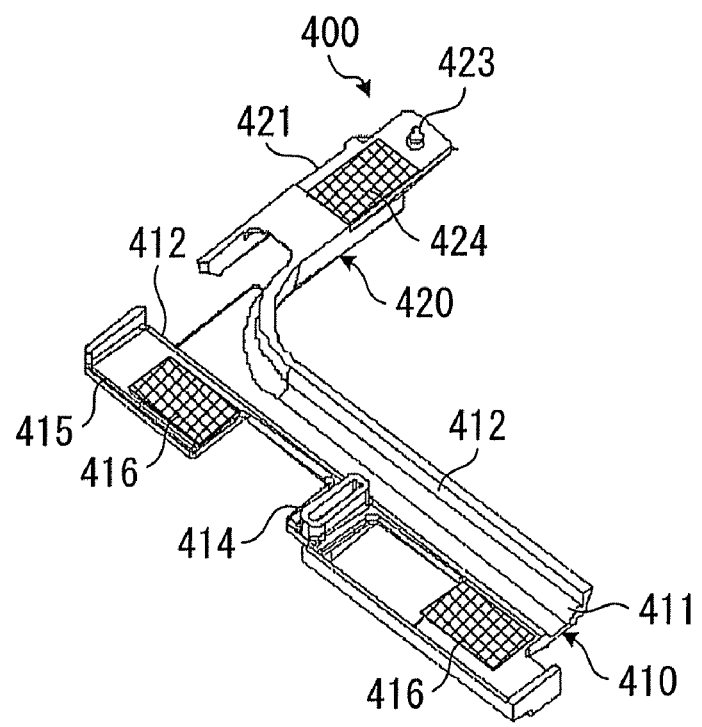
FIG. 3D is a bottom perspective view illustrating the overall construction of the cable mount cover.
Figure 3E:
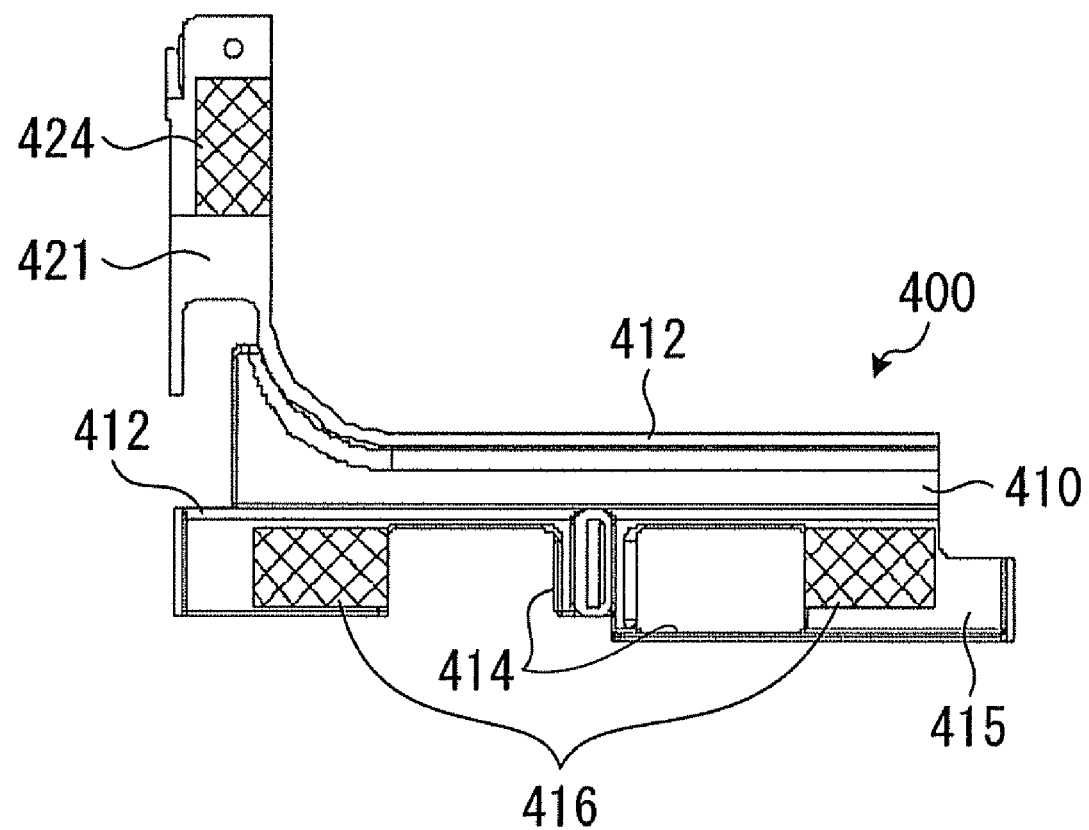
FIG. 3E is a back diagram illustrating the overall construction of the cable mount cover.
Figure 4:
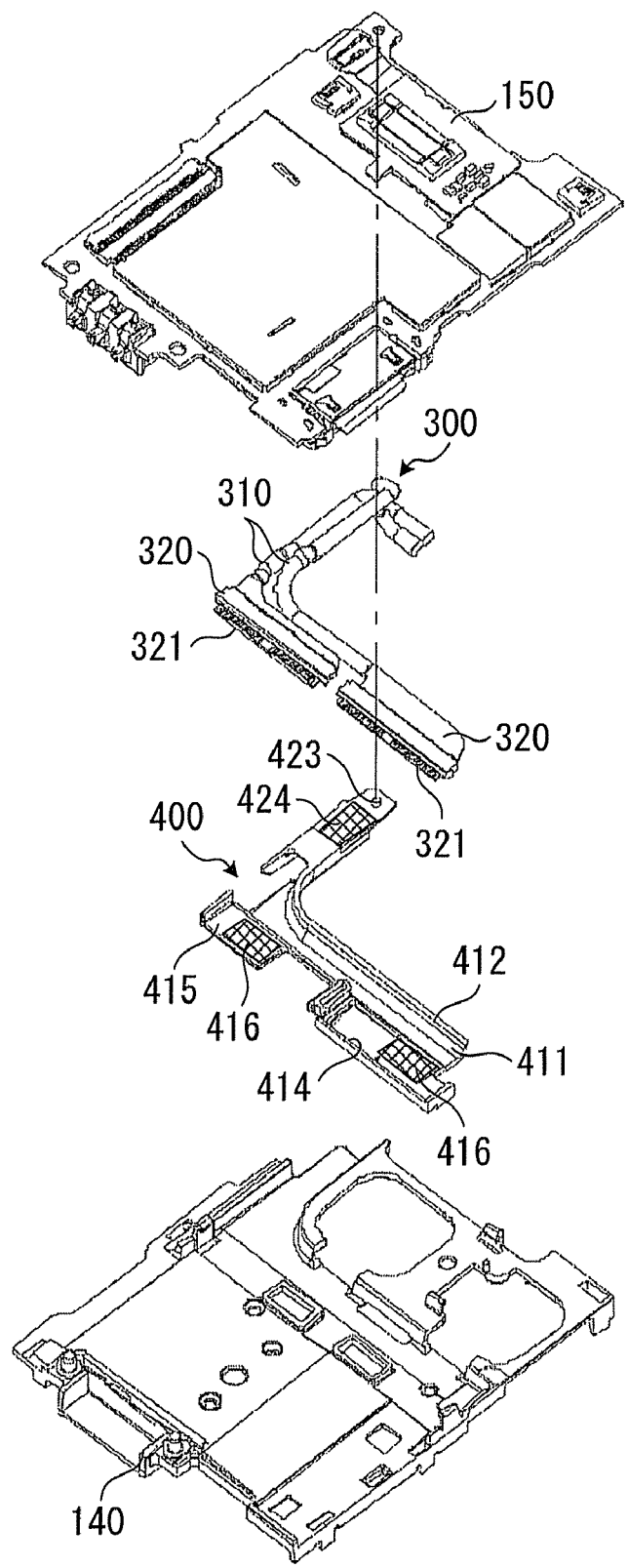
FIG. 4 is an exploded perspective view illustrating the fixing of the cable mount cover, which is taken from the upper side.
Figure 5:
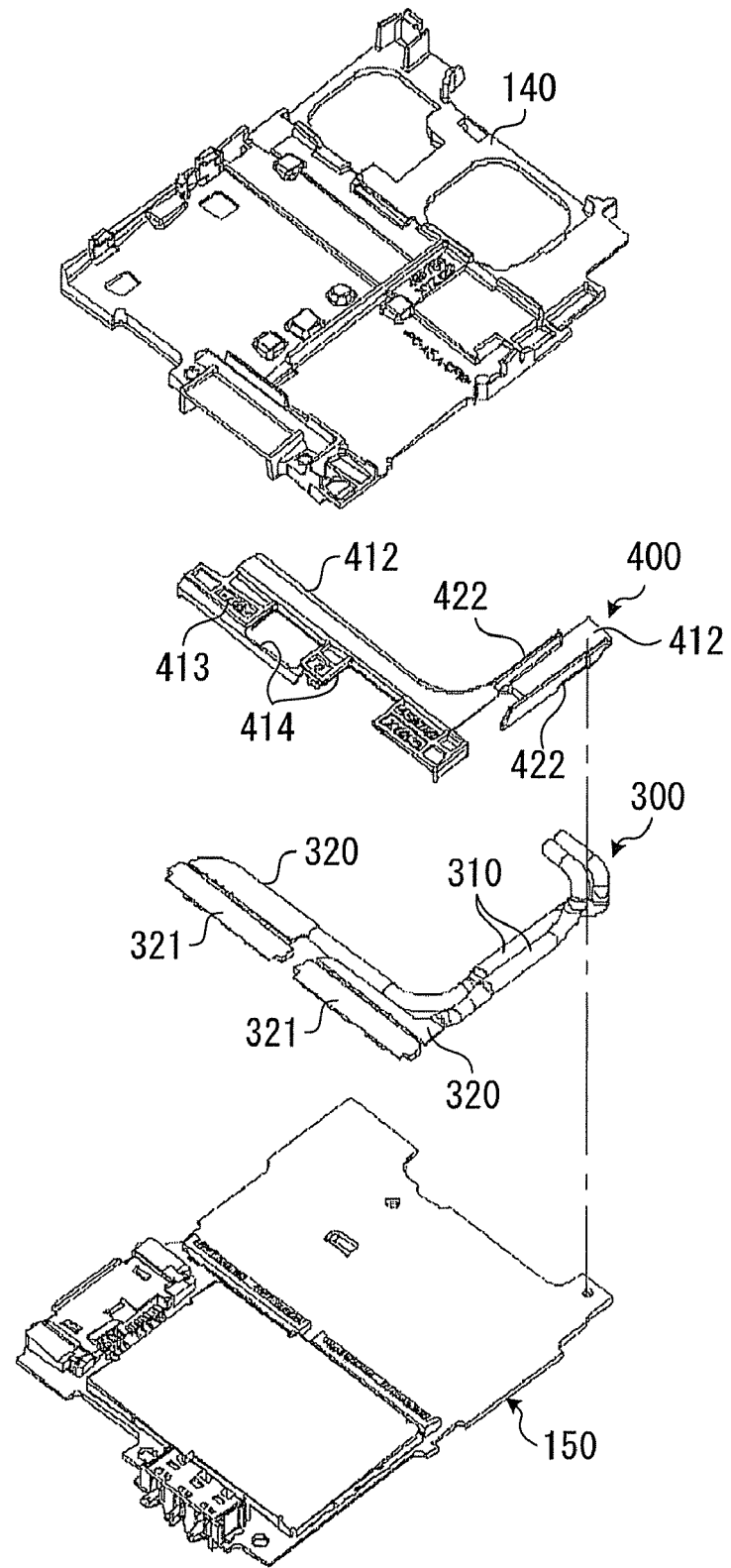
FIG. 5 is an exploded perspective view illustrating the fixing of the cable mount cover, which is taken from the lower side.

The detailed construction of the cable mount cover will be described with reference to FIG. 3A to 3E. FIG. 3A is a plan view illustrating the overall construction of a cable mount cover. FIG. 3B is a side view illustrating the overall construction of the cable mount cover. FIG. 3C is a top perspective view illustrating the overall construction of the cable mount cover. FIG. 3D is a bottom perspective view illustrating the overall construction of the cable mount cover. FIG. 3E is a back diagram illustrating the overall construction of the cable mount cover. FIG. 4 is an exploded perspective view illustrating the fixing of the cable mount cover, which is taken from the upper side. FIG. 5 is an exploded perspective view illustrating the fixing of the cable mount cover, which is taken from the lower side.

The thin-wire coaxial cable 300 has cable main body portions 310 and connection connectors 320 provided to the tip portions of the cable main body portions 310. The terminal portions 321 of the connection connectors 320 of the thin-wire coaxial cable 300 are connected to connectors 156 of a circuit board 155 provided to the circuit board base 150.

The cable mount cover 400 which functions as the protection of the cable main body portions 310 of the thin-wire coaxial cable 300 and a guide groove for the cable main body portions 310 is adhesively attached and fixed to the upper surface of the circuit board base 150. Accordingly, the cable mount cover protects the cable main body portions 310 of the thin-wire coaxial cable 300, stabilizes the wiring route of the cable and prevent the positional displacement of the thin-wire coaxial cable 300 when the thin-wire coaxial cable 300 is mounted.

As shown in FIGS. 3A to 3E and FIGS. 4 and 5, the cable mount cover 400 is designed to be substantially L-shaped as a whole. The cable mount cover 400 comprises the connector enclosure member 410 which is formed to be laterally elongated and mainly encloses the two connection connectors 320 of the thin-wire coaxial cable 300 to protect the two connection connectors 320, and the cable enclosure member 420 which is formed to be longitudinally elongated and mainly encloses the cable main body portions 310 of the thin-wire coaxial cable 300 to protect the cable main body portions 310. The cable mount cover 400 is formed of resin material which is transparent over the whole body thereof, and thus the protection state of the thin-wire coaxial cable 300 and the cable routing state can be visually checked.

The connector enclosure member 410 of the cable mount cover 400 is designed to be U-shaped, and also has a flat plate portion 411 and a pair of side surface portions 412 located at both the sides of the flat plate portion 411. The lower surface portion of an upper surface plate portion 413 which constitutes the connector enclosure member 410 and is provided with a cut-out 414 abuts against the upper surface of the connector 156 fixed to the circuit board 155, whereby the connection connector 320 of the thin-wire coaxial cable 300 can be prevented from dropping out from the connector 156. According to an aspect of an embodiment, a plurality of cut-outs 414 is provided corresponding to respective plurality of circuit board connectors 156.

Two double-faced adhesive tapes 416 are fixed at two positions on the lower surface portion of a lower surface plate portion 415 of the connector enclosure member 410, and the adhesive surfaces of the two double-faced adhesive tapes 416 serve as adhesive fixing surfaces to the circuit board base 150, The cable enclosure member 420 has a flat plate portion 421 and a pair of side surface portions 422 located at both the sides of the flat plate portion 421. As shown in FIG. 3D, a positioning pin 423 is provided to one end portion of the lower surface portion of the flat plate portion 421 so as to project from the flat plate portion 421. The positioning pin 423 is engagedly fitted in an engaging hole 151 of the circuit board base 150, whereby the cable mount cover 400 can be positioned to the circuit board base 150.

One double-faced adhesive tape 424 is fixed to the lower surface portion of the flat plate portion 421. The adhesive surface of the double-faced tape 424 serves as an adhesive surface to the circuit board base 150. Plating or metal deposition treatment is conducted on the cable mount cover 400, whereby the grounding of the circuit board base 150 and the connector 156 of the circuit board 155 is strengthened.

[Fixing Method of Cable Mount Cover 400]

Figure 6A:
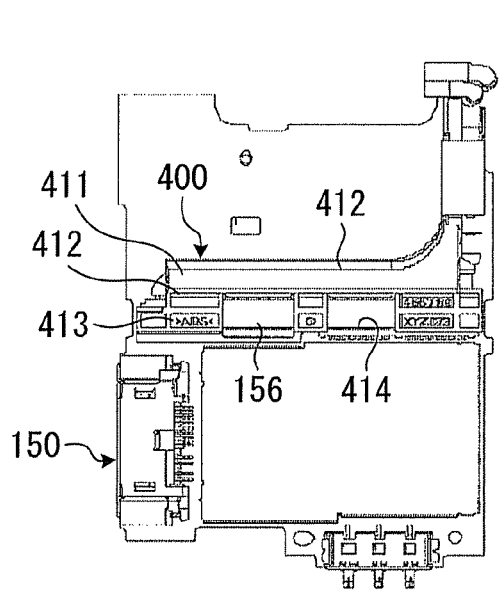
FIGS. 6A, 6B and 6C are diagram illustrating the fixing procedure of a thin-wire coaxial cable and the cable mount cover.
Figure 6B:
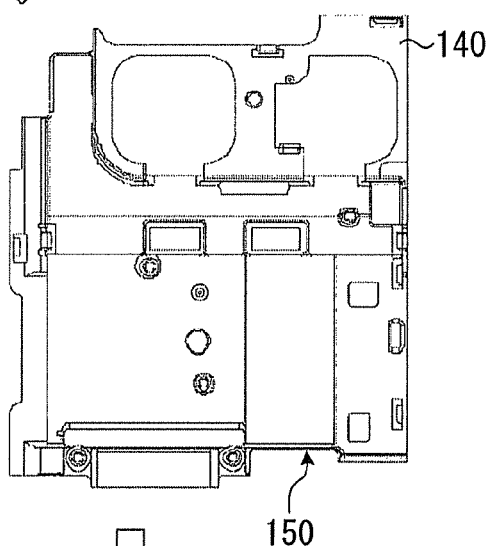
Figure 6C:
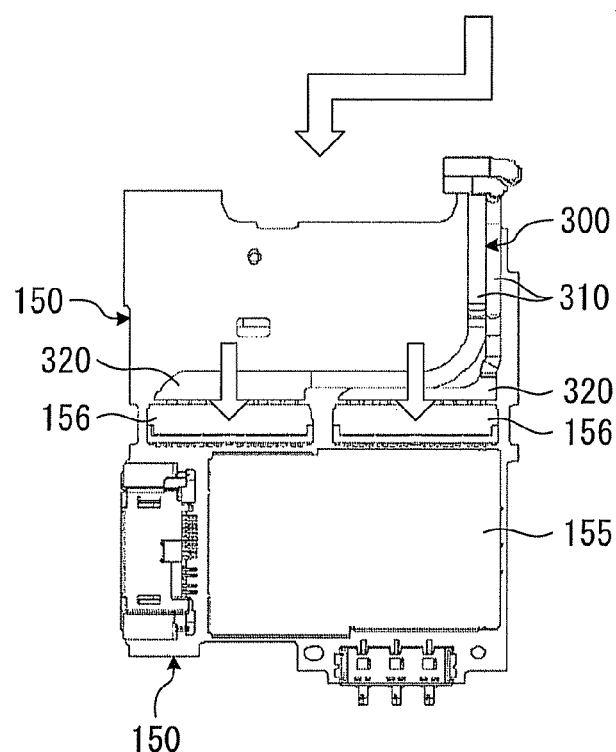
Figure 7:
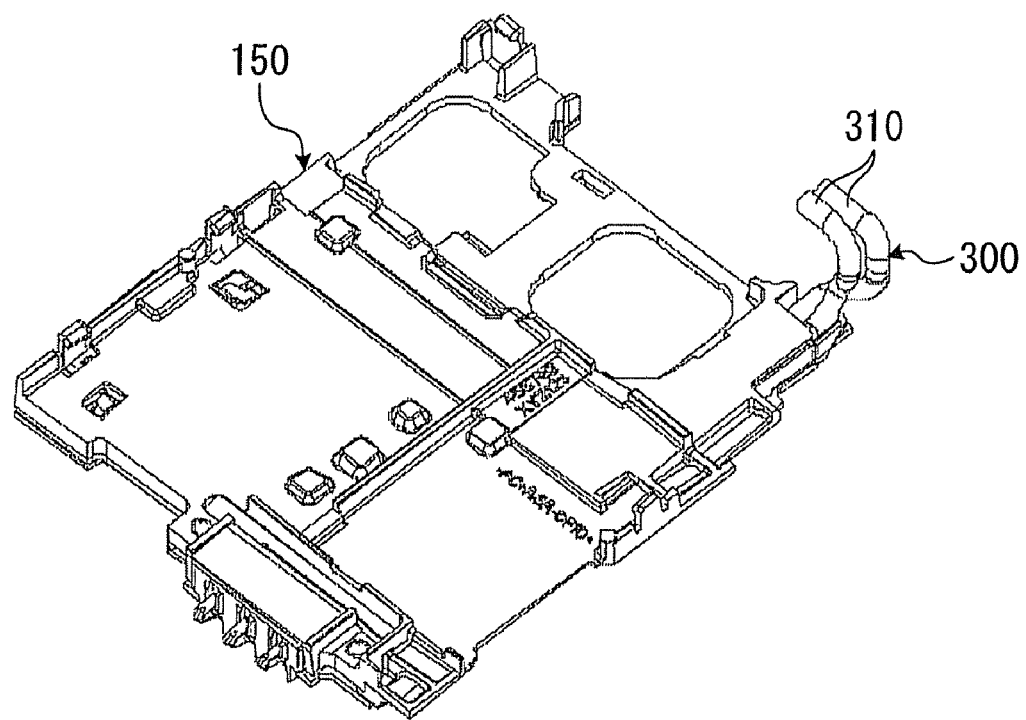
FIG. 7 is a back view illustrating a circuit board base of FIG. 6.

An example of the procedure of fixing the thin-wire coaxial cable 300 and the cable mount cover 400 to the circuit board base 150 will be described. FIGS. 6A, 6B and 6C are diagram illustrating the fixing procedure of a thin-wire coaxial cable and the cable mount cover. FIG. 7 is a back view illustrating a circuit board base of FIG. 6C.

As illustrated in FIG. 6A, the cable mount cover 400 is attached to a predetermined position of the circuit board base 150. Specifically, the cable mount cover 400 can be adhesively attached to the circuit board base 150 by the double-faced adhesive tape 416 of the connector enclosure member 410 of the cable mount cover 400 and the double-faced adhesive tape 424 provided to the cable enclosure member 420.

As illustrated in FIG. 6B, the fixing frame 140 is secured to the circuit board base 150.

As illustrated in FIG. 6C, each of the terminal portions 321 of the connection connectors 320 of the thin-wire coaxial cable 300 is engagedly fitted into and connected to the connector 156 of the circuit board 155 provided to the circuit board base 150.

As described above, the thin-wire coaxial cable 300 for electrically connecting the electrical current flow passage between the movable-side housing 200 and the fixed-side housing 100 is connected to the connector 156 of the circuit board 155 provided to the fixed-side housing 100 constituting the mobile phone 10 of the first embodiment. The thin-wire coaxial cable 300 is disposed on the circuit board base 150 while enclosed in each of the cable enclosure member 420 and the connector enclosure member 410 of the cable mount cover 400. Accordingly, in the mobile phone 10 of the first embodiment, the wire breaking of the thin-wire coaxial cable 300 can be prevented, the wire route of the cable can be stabilized and the positional displacement of the thin-wire coaxial cable 300 when the thin-wire coaxial cable 300 is mounted can be prevented.

Other Embodiments

According to an aspect of the embodiments of the invention, any combinations of the described features, functions, operations, and/or benefits can be provided. The first embodiment is applied to the folding type mobile phone with the hinge portion. However, the mobile phone of this embodiment can be applied to various kinds of hinge structures. For example, this embodiment may be applied to a mobile phone having a slide type or a turn type connection structure.

In the first embodiment, the mobile phone is applied as the mobile terminal device. However, this embodiment may be applied to various kinds of mobile terminal devices such as a compact information processing terminal device such as PDA (Personal Digital Assistants), a compact music reproducing device, a portable television, a portable game machine, etc.

All examples and conditional language recited herein are for pedagogical purposes to aid the reader in understanding the principles of the invention and the concepts contributed by the inventor to furthering the art, and are to be construed as being without limitation to such specifically recited examples and conditions, nor does the organization of such example in the specification relate to a showing of the superiority and inferiority of the invention. Although the embodiments of the present inventions have been described in detail, it should be understood that the various changes, substitutions (equivalents), and alterations could be made hereto without departing from the spirit and scope and scope of the invention.

What is claimed is:

1. A mobile terminal device comprising:
a movable side housing;
a fixed side housing connected to the movable side housing with a hinge part;
a thin-wire coaxial cable for passage of electric current flow is electrically connected between the movable side housing and the fixed side housing; and
a cable mount cover member protecting the thin-wire coaxial cable,
wherein the thin-wire coaxial cable has a cable main body having plural thin wires embedded therein and a connection connector having terminal portions and connected to the cable main body, and the cable mount cover member has a cable enclosure member enclosing the cable main body and a connector enclosure member enclosing an area surrounding the connection connector connected to the cable main body, and
wherein the terminal portions of the connection connector are connected to a circuit board of the fixed side housing and a circuit board connector support face on a lower surface portion of the connector enclosure member supports an upper surface portion of a circuit board connector provided to the circuit board and connected to the connection connector.

2. The mobile terminal device according to claim 1, wherein a cover plating treatment or a metal deposition treatment is conducted on a whole area or a predetermined area of the cable enclosure member and the connector enclosure member.

3. The mobile terminal device according to claim 1, wherein a positioning pin is formed at a predetermined position of the cable enclosure member so as to be freely engagedly fitted in an engaging hole formed in a circuit board base of the fixed side housing.

4. The mobile terminal device according to claim 1, wherein the cable mount cover is formed of a resin member which is transparent over a whole body thereof.

5. The mobile terminal device according to claim 1, wherein the connector enclosure member is U-shaped.

6. The mobile terminal device according to claim 1, wherein the circuit board connector support face of the connector enclosure member has one or more cut-outs abutting against the upper surface portion of the circuit board connector, preventing disengagement of the connection connector from the circuit board connector.

* * * * *